(12) United States Patent
Bhuyan et al.

(10) Patent No.: US 11,545,354 B2
(45) Date of Patent: Jan. 3, 2023

(54) MOLECULAR LAYER DEPOSITION METHOD AND SYSTEM

(71) Applicants: Applied Materials, Inc., Santa Clara, CA (US); National University of Singapore, Singapore (SG)

(72) Inventors: Bhaskar Bhuyan, Milpitas, CA (US); Zeqing Shen, San Jose, CA (US); Bo Qi, San Jose, CA (US); Abhijit Basu Mallick, Fremont, CA (US); Xinke Wang, Singapore (SG); Mark Saly, Milpitas, CA (US)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 132 days.

(21) Appl. No.: 16/935,385

(22) Filed: Jul. 22, 2020

(65) Prior Publication Data
US 2022/0028686 A1   Jan. 27, 2022

(51) Int. Cl.
*H01L 21/02* (2006.01)
*B05D 1/00* (2006.01)

(52) U.S. Cl.
CPC ......... *H01L 21/02118* (2013.01); *B05D 1/60* (2013.01); *H01L 21/0228* (2013.01); *H01L 21/02205* (2013.01); *H01L 21/02318* (2013.01)

(58) Field of Classification Search
None
See application file for complete search history.

(56) References Cited

U.S. PATENT DOCUMENTS

2016/0060754 A1* 3/2016 Noh .................. C23C 16/26
427/249.1
2016/0343580 A1   11/2016 Hudson
(Continued)

FOREIGN PATENT DOCUMENTS

| JP | 2019-212776 A | 12/2019 |
| KR | 2002-0043702 A | 6/2002 |
| WO | 2019-173074 A2 | 9/2019 |

OTHER PUBLICATIONS

Zhou, "Fabrication of organic interfacial layers by molecular layer deposition: Present status and future opportunities", Vac. Sci. Technol. A 31, 040801(1-18), (2013). (Year: 2013).*

(Continued)

*Primary Examiner* — Asok K Sarkar
(74) *Attorney, Agent, or Firm* — Kilpatrick Townsend & Stockton LLP (57) ABSTRACT

Exemplary processing methods may include flowing a first deposition precursor into a substrate processing region to form a first portion of an initial compound layer. The first deposition precursor may include an aldehyde reactive group. The methods may include removing a first deposition effluent including the first deposition precursor from the substrate processing region. The methods may include flowing a second deposition precursor into the substrate processing region. The second deposition precursor may include an amine reactive group, and the amine reactive group may react with the aldehyde reactive group to form a second portion of the initial compound layer. The methods may include removing a second deposition effluent including the second deposition precursor from the substrate processing region. The methods may include annealing the initial compound layer to form an annealed carbon-containing material on the surface of the substrate.

20 Claims, 3 Drawing Sheets

(56) References Cited

U.S. PATENT DOCUMENTS

2019/0294046 A1 9/2019 Nishimaki et al.
2019/0368034 A1 12/2019 Liu et al.
2020/0312672 A1* 10/2020 Yamaguchi ........ C08G 18/3228

OTHER PUBLICATIONS

International Search Report and Written Opinion dated Nov. 10, 2021 in International Patent Application No. PCT/US2021/042663, 12 pages.

* cited by examiner

MOLECULAR LAYER DEPOSITION METHOD AND SYSTEM

TECHNICAL FIELD

The present technology relates to semiconductor processing. More specifically, the present technology relates to methods and systems for depositing and annealing converting carbon-containing materials on semiconductor substrates.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other feature formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature including between sidewalls within the feature, and may produce voids within the feature. This can impact device performance and subsequent processing operations.

Thus, there is a need for improved systems and methods that can be used to produce high quality devices and structures. These and other needs are addressed by the present technology.

SUMMARY

Embodiments of the present technology include processing methods to form a carbon-containing material on a substrate using molecular layer deposition (MLD). The methods may include flowing a first deposition precursor into a substrate processing region to form a first portion of an initial compound layer. The first deposition precursor may include an aldehyde reactive group. The methods may include removing a first deposition effluent including the first deposition precursor from the substrate processing region. The methods may include flowing a second deposition precursor into the substrate processing region. The second deposition precursor may include an amine reactive group, and the amine reactive group may react with the aldehyde reactive group to form a second portion of the initial compound layer. The methods may include removing a second deposition effluent including the second deposition precursor from the substrate processing region. The methods may include annealing the initial compound layer to form an annealed carbon-containing material on the surface of the substrate.

In some embodiments, the methods may include depositing at least one additional compound layer on the initial compound layer. The initial compound layer and the at least one additional compound layer may form the annealed carbon-containing material on the surface of the substrate. The first deposition precursor may be delivered at a temperature greater than or about 100° C. The second deposition precursor may be delivered at a temperature less than or about 100° C. The first deposition time and the second deposition time may be less than or about 5 seconds. The first deposition time may be longer than the second deposition time. The flowing of the first deposition precursor may increase pressure in the substrate processing region to a pressure range of about 1 mTorr to about 500 Torr. The removal of the first deposition effluent from the substrate processing region may include a removal time of less than or about 60 seconds. Exemplary thermal annealing temperatures for the annealing of the compound layer may be greater than or about 100° C. (e.g., about 100° C. to about 600° C.). In some embodiments, the deposited and annealed initial compound layer shrinks by less than 10 vol % due to the annealing of the initial compound layer. In some embodiments, the substrate may include one or more substrate features characterized by an aspect ratio of greater than or about 5:1, and a width of less than or about 10 nm. In some embodiments, the methods may still further include depositing at least one additional compound layer on the initial compound layer, where the initial compound layer and the at least one additional compound layer form the annealed carbon-containing material on the surface of the substrate.

Embodiments of the present technology also include processing methods that include flowing a first deposition precursor into a substrate processing region. The first deposition precursor may be characterized by a first formula that includes:

$$Y_1-R_1-Y_2,$$

where $R_1$ comprises one or more of an alkyl group, an aromatic group, or a cycloalkyl group, and $Y_1$ and $Y_2$ independently comprise a hydroxide group, an aldehyde group, a ketone group, an acid group, an amino group, an isocyanate group, a thiocyanate group, or an acyl chloride group.

The first deposition precursor may react with a reactive group on a surface of a substrate in the substrate processing region to form a first portion of an initial compound layer on the surface of the substrate. The methods may further include removing a first deposition effluent comprising the first deposition precursor from the substrate processing region, and flowing a second deposition precursor into the substrate processing region. The second deposition precursor may be characterized by a second formula that includes:

$$Z_1-R_2-Z_2,$$

where $R_2$ comprises one or more of an alkyl group, an aromatic group, or a cycloalkyl group, and $Z_1$ and $Z_2$ independently comprise a hydroxide group, an aldehyde group, a ketone group, an acid group, an amino group, an isocyanate group, a thiocyanate group, or an acyl chloride group, The second deposition precursor may react with the first portion of the initial compound layer to form a second portion of the initial compound layer. The methods may further include removing a second deposition effluent comprising the second deposition precursor from the substrate processing region. The methods may also include annealing the initial compound layer to form an annealed carbon-containing material on the surface of the substrate.

In additional embodiments, exemplary $R_1$ may be an aromatic group, exemplary $Y_1$ and $Y_2$ may independently be an aldehyde group or an isocyanate group, exemplary $R_2$ may be a alkyl group, and exemplary $Z_1$ and $Z_2$ may be an amino group. Exemplary first deposition precursors may include terephthalaldehyde or 1,4-phenylene diisocyanate, and exemplary second deposition precursors may include ethylene diamine. In further embodiments, the removing of the first deposition precursor may include flowing a purge gas into the substrate processing region, and removing a mixture of the first deposition effluent and the purge gas from the substrate processing region. Exemplary purge gases may include helium.

Embodiments of the present technology further include processing methods that perform two or more cycles of forming a carbon-containing composite layer on a substrate. Each of the two or more cycles of forming the carbon-containing composite layer may include forming a first portion of a compound layer on a surface of the substrate, where the first portion of the compound layer is formed by flowing a first deposition precursor into a substrate processing region, where the first deposition precursor reacts with a reactive group on the surface of the substrate in the substrate processing region to form the first portion of the compound layer. Each of the two or more cycles may also include forming a second portion of the compound layer on at least a portion of the first compound layer, where the second portion of the compound layer is formed by flowing a second deposition precursor into the substrate processing region, and the second deposition precursor reacts with the first portion of the initial compound layer to form the second portion of the compound layer. The two or more carbon-containing composite layers on the substrate may be annealed to form an annealed carbon-containing material on the surface of the substrate.

In additional embodiments, the first deposition precursor may include terephthalaldehyde or 1,4-phenylene diisocyanate, and the second deposition precursor may include ethylene diamine. In further embodiments, the two or more carbon-containing compound layers shrink by less than 10 vol % due to the annealing of the compound layers.

Such technology may provide numerous benefits over conventional systems and methods. For example, embodiments of the present technology produce carbon-containing layers significantly fewer voids, fractures, and other physical defects than carbon-containing materials formed by conventional methods. The present technology may also form carbon-containing materials with higher density and lower porosity than materials formed by conventional methods. Further details about embodiments of the present technology, along with many of their advantages and features, are described in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Carbon-containing materials may be used in semiconductor device manufacturing for a number of structures and processes, including as a mask material, an etch resistant material, and a trench fill material, among other applications. More specific examples of applications for carbon-containing materials include the formation of hot implant hardmasks, metal gate (MG)-cut hardmasks, metal gate fabrication, and reverse tone patterning, among others. The present technology includes the formation of these carbon-containing materials on semiconductor substrates using molecular layer deposition (MLD).

Embodiments of the present technology include molecular layer deposition (MLD) methods and systems to form a carbon-containing material on a semiconductor substrate. Exemplary MLD methods may include providing a first deposition precursor to a surface of a semiconductor substrate, where the precursor forms a first layer (e.g., a first monolayer) on the substrate surface. During or after the formation of the first layer, unbound deposition effluents, which may include unbound molecules of the first deposition precursor, are removed from a processing region in which the semiconductor substrate is exposed. A second deposition precursor may then be introduced to the semiconductor substrate, where molecules of the second deposition precursor bind to reactive moieties on the first layer to form a second layer (e.g., a second monolayer). During or after the formation of the second layer, unbound deposition effluent, which may include unbound molecules of the second deposition precursor, are removed from the processing region. The semiconductor substrate now has a first compound layer made of the first layer bound to the semiconductor substrate, and the second layer bound to the first layer. Additional compound layers of first and second layers may be built up on the deposited layers until the number of built up compound layers reaches a desired thickness of carbon-containing material on the semiconductor substrate. The compound layers may then be annealed to form the carbon-containing material on the semiconductor substrate.

The present technology offers solutions to problems with conventional methods of forming a carbon-containing material on a semiconductor substrate. For example, the present technology forms a carbon-containing material with significantly fewer voids, fractures, and other physical defects than carbon-containing materials formed using spin-on-carbon (SOC) and flowable chemical-vapor-deposition (FCVD) methods. The present technology may also form carbon-containing materials with higher density and lower porosity than materials formed with SOC and FCVD.

The high levels of hydrogen found in many SOC and FCVD precursors result in high levels of shrinkage when the as-deposited materials are treated to form a final material. Shrinkage as high as 50 vol. % is not uncommon for as-deposited SOC and FCVD materials following treatment, which creates gaps, fractures and voids in treated material, as well as stresses on substrate features in contact with the material. The present technology produces treated carbon-containing materials with less than 10 vol. % shrinkage of the as-deposited material (e.g., 5-10 vol. % shrinkage, less than about 5 vol. % shrinkage).

The present technology also offers solutions to problems with conventional plasma deposition methods of forming a carbon-containing material on a semiconductor substrate. Conventional plasma deposition methods such as plasma-enhanced chemical-vapor-deposition (PECVD) and high-density-plasma chemical-vapor-deposition (HDPCVD) often create ion sputtering that causes damage to substrate features on the semiconductor substrate. The can also create re-sputtered ions and other species that can cause defects in the deposited carbon-containing material. In addition, they often deposit the material unevenly in and around substrate features, creating voids in and around substrate trenches and steps, and uneven surfaces in planar substrate regions. The present technology may form carbon-containing materials with a high level of conformity in narrow substrate features (e.g., dimension widths less than about 25 nm) and high aspect ratios (e.g., AR of 10:1 or more) without the need for plasmas that can damage the substrate feature during deposition.

Figure 1:
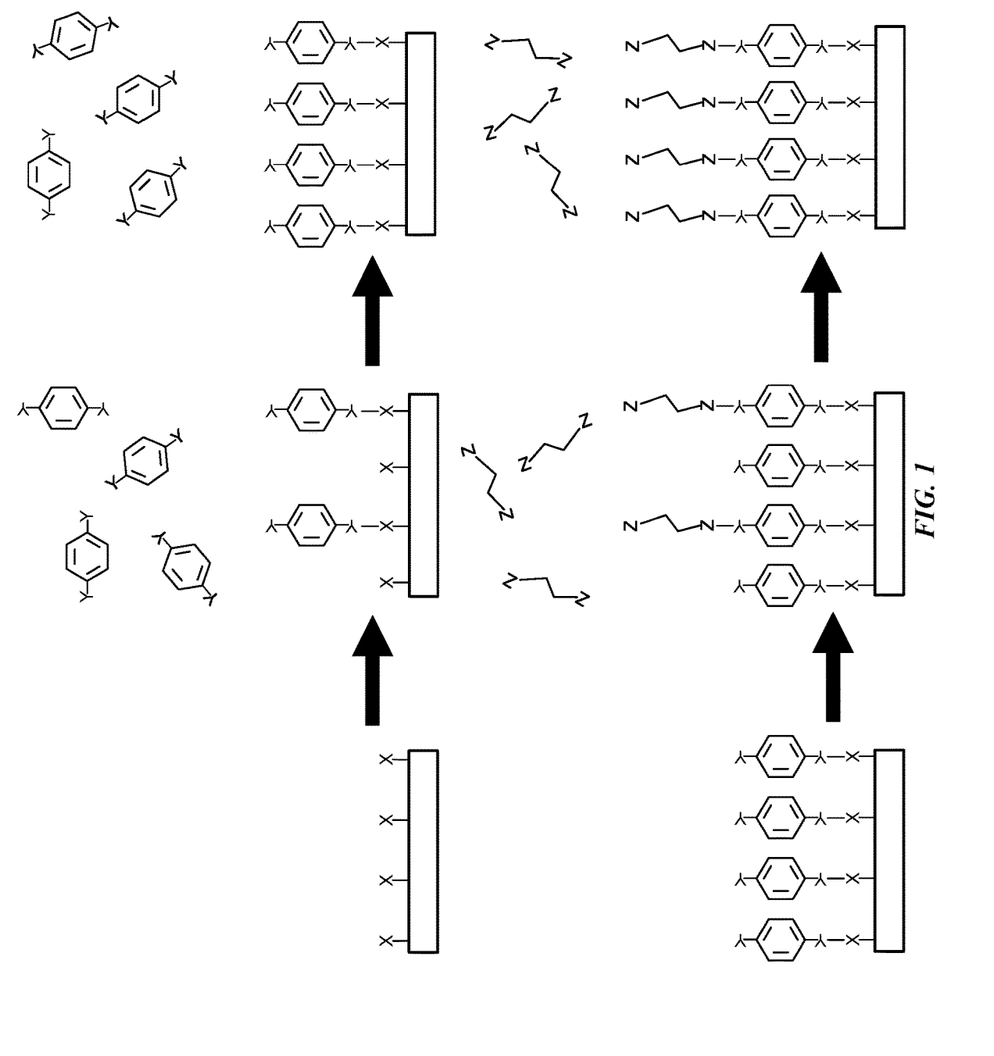
FIG. 1 illustrates stages in the formation of a portion of a compound layer deposited by a molecular layer deposition process according to some embodiments of the present technology.

FIG. 1 shows a simplified cross-section of a substrate surface during six phases of an exemplary MLD process to form a compound layer on a substrate surface. The first cross-section 102 shows a portion of a substrate that has reactive surface species "—X" available to bond with a first deposition precursor that has the formula:

where "—Y" represents a reactive group that can form a covalent bond with the "—X" group on the substrate surface under accommodating reaction conditions. The next cross-section 104 shows the first deposition precursor being introduced to the substrate surface and some molecules of the precursor forming covalent bonds with the —X groups on surface. The following cross-section-106 shows the molecules of the first deposition precursor saturating the available —X groups to form a first portion of the compound layer (e.g., a first monolayer) and leaving additional precursor molecules suspended in the gas phase as part of a first deposition precursor effluent. The subsequent cross-section 108 shows the unreacted molecules in the first deposition precursor being removed from the vicinity of the substrate surface in order to prepare for the introduction of the second deposition precursor.

In some embodiments, the —X groups may have a greater number density (e.g., —X groups/unit area) on some parts of the substrate than others. For example, there may be a greater number of —X groups per unit area on a bottom surface of a substrate gap, trench, or other substrate feature, than the number of —X groups on the sidewalls (e.g., vertical surfaces) of the substrate feature. For example, in some embodiments, a base of a feature may more readily form reactive ligands of the first deposition precursor, and thus a base unit area of the substrate may produce at least 1.1 times the number of reactive ligands as a sidewall, and may produce at least 1.2 times the number of reactive ligands, at least 1.4 times the number of reactive ligands, at least 1.6 times the number of reactive ligands, at least 1.8 times the number of reactive ligands, at least 2.0 times the number of reactive ligands, at least 2.5 times the number of reactive ligands, at least 3.0 times the number of reactive ligands, at least 5.0 times the number of reactive ligands, at least 10.0 times the number of reactive ligands, or more. In these embodiments, the MLD process may form compound layers on the bottom surface of the substrate feature where the —X groups have the greater number density, and form little or no compound layers on the sidewall surfaces of the substrate feature where the —X group number density is lower or zero. These embodiments facilitate a bottom-up-gapfill of the compound layers in the substrate feature with a significantly reduced possibility of void or seam formation from MLD-deposited materials building up on the sidewalls of the substrate feature.

The second deposition precursor shown in this example is represented by the formula:

where "—Z" represents a reactive group that can form a covalent bond with an unreacted "—Y" on the layer formed by the reaction of the first deposition precursor with the available "—X" groups on the substrate surface. Cross-section 110 shows the second deposition precursor being introduced to the substrate surface and some molecules of the second precursor forming covalent bonds with available —Y groups in the layer formed by the first precursor. The next cross-section 112 shows the molecules of the second deposition precursor saturating the available —Y groups to form a second portion of the compound layer (e.g., a second monolayer) and leaving additional precursor molecules suspended in the gas phase as part of a first deposition precursor effluent. The unreacted second precursor molecules in the second deposition precursor effluent may be removed from the substrate surface to prepare for the formation of additional compound layers or a treatment of the compound layer to form the carbon-containing material on the substrate.

In the embodiment shown in FIG. 1, the first deposition precursor may include two reactive groups "—Y" arranged in the para position around a central aromatic ring. Exemplary —Y groups may include a hydroxide group, an aldehyde group, a ketone group, an acid group, an amino group, an isocyanate group, a thiocyanate group, or an acyl chloride group, among other reactive groups. In additional embodiments, there may be two or more —Y groups, three or more —Y groups, four or more —Y groups, five or more —Y groups that arranged around the aromatic ring. Additional embodiments also include each —Y group being the same reactive group, at least two —Y groups being different reactive groups, and all —Y groups being different reactive groups, among other combinations of —Y groups in the first deposition precursor. Specific examples of first deposition precursors include hydroquinone, terephthalaldehyde, terephthaloyl chloride, and p-phenylenediamine, among others.

The second deposition precursor in the embodiment shown in FIG. 1 includes two reactive groups "—Z" arranged on opposite carbons of an ethyl group. The reactive "—Z" groups are selected to be reactive with "—Y" groups under the processing conditions proximate to the substrate surface where the first portion of the compound layer was formed. Exemplary —Z groups may include a hydroxide group, an aldehyde group, a ketone group, an acid group, an amino group, an isocyanate group, a thiocyanate group, or an acyl chloride group, among other reactive groups. Specific examples of second deposition precursors include ethylene glycol, and ethylene diamine, among others.

The —Y groups and —Z groups may be selected to form a covalent reaction bond when the groups come into contact near the substrate surface. Exemplary combinations of —Y groups and —Z groups in the first and second deposition precursors may include acyl chloride —Y groups and hydroxyl —Z groups, and aldehyde —Y groups and amino —Z groups, among other combinations of —Y groups and —Z groups. Specific combinations of first and second deposition precursors may include terephthaloyl chloride and ethylene glycol, terephthalaldehyde and ethylene diamine, and p-phenylenediamine and succinaldehyde, among other combinations.

In still further embodiments, the first deposition precursor may include a central linking group other than a phenyl group, and the second deposition precursor may include a central linking group other than an ethylene group. For example, the first and second deposition precursors may be represented by:

$$Y-R_1-Y; \text{ and}$$

$$Z-R_2-Z,$$

where the —Y groups may be as described above and the —$R_1$— and —$R_2$— groups may independently represent an alkyl group, an aromatic group, or a cycloalkyl group, among other types of hydrocarbon groups.

Figure 2:
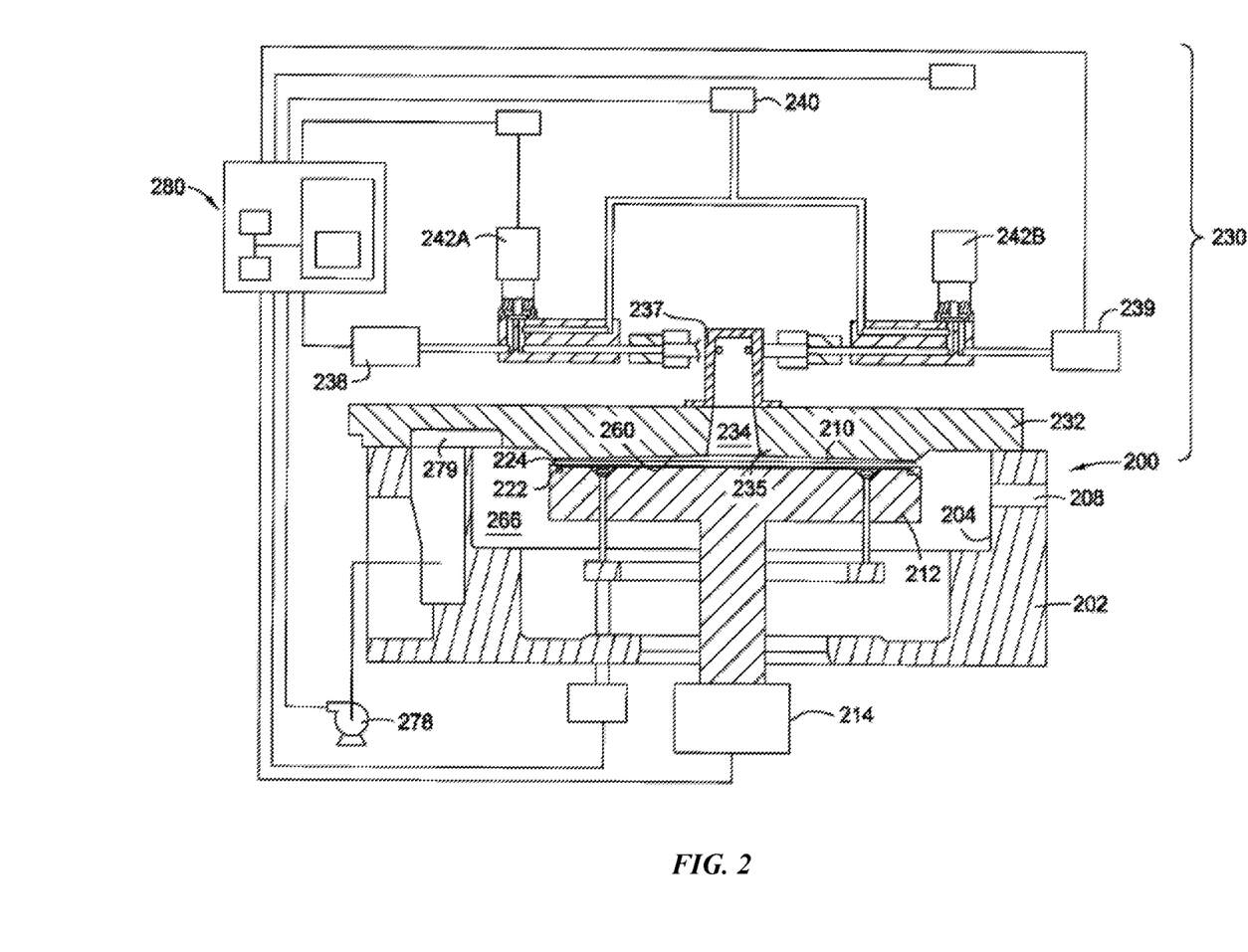
FIG. 2 shows a schematic cross-sectional view of an exemplary processing chamber according to some embodiments of the present technology.

FIG. 2 shows a cross-sectional view of an exemplary processing chamber 100 according to some embodiments of the present technology. The figure may illustrate an overview of a system incorporating one or more aspects of the present technology, and/or which may perform one or more deposition or other processing operations according to embodiments of the present technology. Additional details of chamber 200 or methods performed may be described further below. Chamber 200 may be utilized to form composite layers according to some embodiments of the present technology, although it is to be understood that the methods may similarly be performed in any chamber within composite film formation may occur.

Referring to FIG. 2, the chamber 200 includes a chamber body 202 having a slit valve 208 formed in a sidewall 204 thereof and a substrate support 212 disposed therein. The substrate support 212 is mounted to a lift motor 214 to raise and lower the substrate support 212 and a substrate 210 disposed thereon. The substrate support 212 may also include a vacuum chuck, an electrostatic chuck, or a clamp ring for securing the substrate 210 to the substrate support 212 during processing. Further, the substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 that provides a purge gas to prevent deposition on a peripheral portion of the substrate 210.

A precursor delivery apparatus 230 is disposed at an upper portion of the chamber body 202 to provide a precursor, such as a deposition precursor, carrier gas, and/or a purge gas, to the chamber 200. A vacuum system 278 is in communication with a pumping channel 279 to evacuate deposition effluents and/or other gases from the chamber 200 and to help maintain a desired pressure or a desired pressure range inside a pumping zone 266 of the chamber 200.

The precursor delivery apparatus 230 includes a chamber lid 232 having an expanding channel 234 formed within a central portion thereof. The chamber lid 232 also includes a bottom surface 260 extending from the expanding channel 234 to a peripheral portion of the chamber lid 232. The bottom surface 260 is sized and shaped to substantially cover the substrate 210 disposed on the substrate support 212. The expanding channel 234 has an inner diameter that gradually increases from an upper portion 237 to a lower portion 235 adjacent the bottom surface 260 of the chamber lid 232. The velocity of a precursor flowing therethrough decreases as the precursor flows through the expanding channel 234 due to the expansion of the precursor. The decreased precursor velocity reduces the likelihood of blowing off reactants adsorbed on the surface of the substrate 210.

The precursor delivery apparatus 230 also includes at least two high speed actuating valves 242 having one or more ports. At least one valve 242 may be dedicated to a particular deposition precursor. For example, a first valve may be dedicated to a first deposition precursor, such as dialdehyde-containing precursor or a diisocyanate-containing precursor, and a second valve may be dedicated to a second deposition precursor, such as a diamino-containing precursor. When a third deposition precursor is desired, a third valve may be dedicated to the third deposition precursor. For example, if the MLD process includes exposing the substrate to both dialdehyde-containing and diisocyanate-containing deposition precursors, the dialdehyde-containing precursor may be introduced through the second valve, and the diisocyanate-containing precursor may be introduced through the third valve.

The valves 242 may be any valve capable of precisely and repeatedly delivering short pulses of deposition precursors, carrier gases, and/or purge gases, into the chamber body 202. In some cases, the on/off cycles or pulses of the valves 242 may be as fast as about 100 msec or less. The valves 242 can be directly controlled by a system computer, such as a mainframe for example, or controlled by a chamber/application specific controller, such as a programmable logic computer (PLC). For example, the valves 242 may be electronically controlled (EC) valves.

Returning to FIG. 2, a control unit 280, such as a programmed personal computer, work station computer, or the like, may be coupled to the chamber 200 to control processing conditions. For example, the control unit 280 may be configured to control flow of the deposition precursors and purge gases from gas sources 238, 239, 240 through the valves 242A, 242B during different stages of a substrate process sequence. The control unit 280 may be one of any form of general purpose computer processor that can be used in an industrial setting for controlling various chambers and sub-processors.

Illustratively, the control unit 280 comprises a central processing unit (CPU), support circuitry, and memory containing associated control software. The CPU may use any suitable memory, such as random access memory, read only memory, floppy disk drive, hard disk, or any other form of digital storage, local or remote. Various support circuits may be coupled to the CPU for supporting the chamber 200. The control unit 280 may be coupled to another controller that is located adjacent individual chamber components, such as the programmable logic controllers of the valves 242A, 242B. Bi-directional communications between the control unit 280 and various other components of the chamber 200 are handled through numerous signal cables collectively referred to as signal buses. In addition to control of process gases and purge gases from gas sources 238, 239, 240 and from the programmable logic controllers of the valves 242A, 242B, the control unit 280 may be configured to be responsible for automated control of other activities used in wafer processing, such as wafer transport, temperature control, chamber evacuation, among other activities, some of which are described elsewhere herein.

Figure 3:
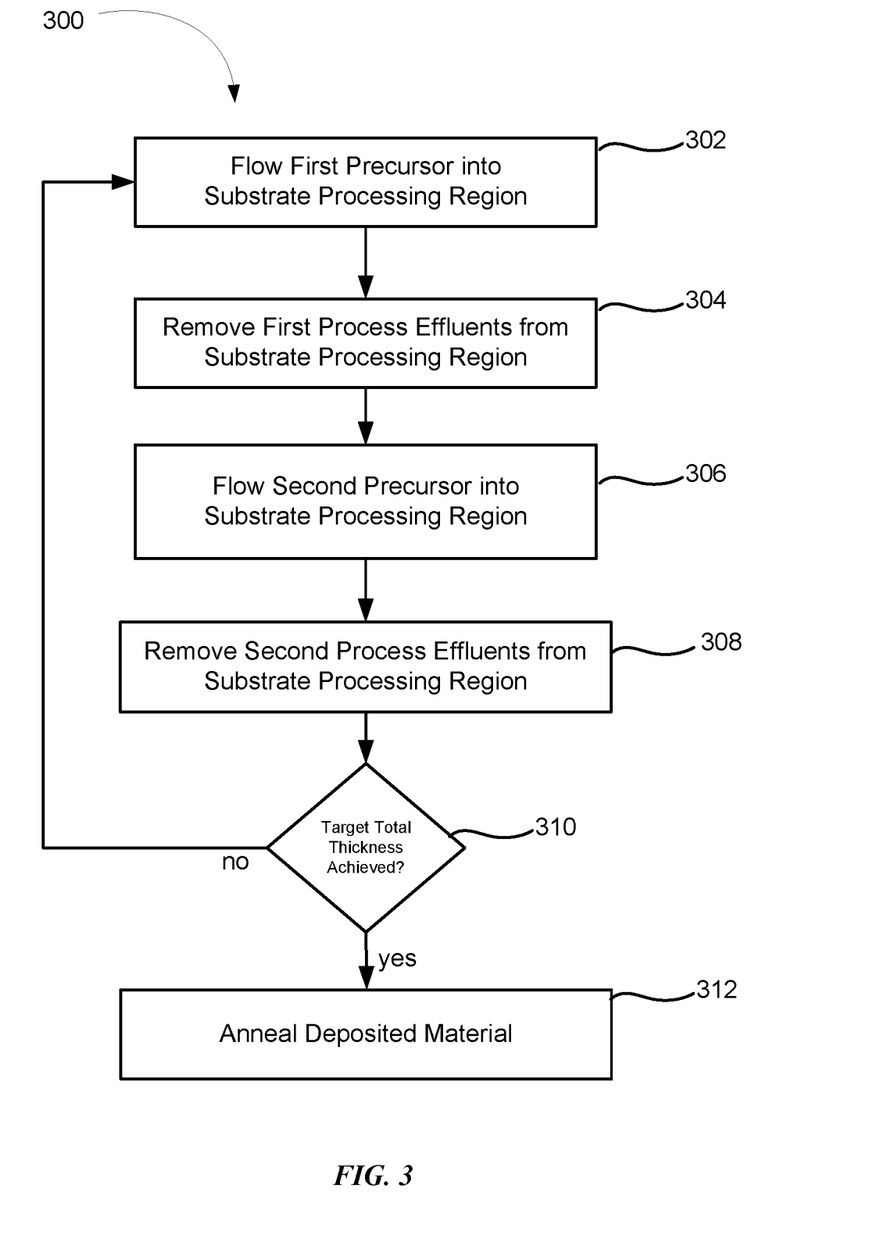
FIG. 3 shows exemplary operations in a processing method according to some embodiments of the present technology.

Processing chamber 200 may be utilized in some embodiments of the present technology for processing methods that may include formation, etching, or conversion of materials for semiconductor structures. It is to be understood that the chamber described is not to be considered limiting, and any chamber that may be configured to perform operations as described may be similarly used. FIG. 3 shows exemplary operations in a processing method 200 according to some embodiments of the present technology. The method may be performed in a variety of processing chambers and on one or more mainframes or tools, including processing chamber 200 described above. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 300 may describe operations shown schematically in FIG. 3, the illustrations of which will be described in conjunction with the operations of method 300. It is to be understood that the figures illustrate only partial schematic views, and a substrate may contain any number of additional materials and features having a variety of characteristics and aspects as illustrated in the figures.

Method 300 may include additional operations prior to initiation of the listed operations. For example, additional processing operations may include forming structures on a semiconductor substrate, which may include both forming and removing material. For example, transistor structures, memory structures, or any other structures may be formed. Prior processing operations may be performed in the chamber in which method 300 may be performed, or processing may be performed in one or more other processing chambers prior to delivering the substrate into the semiconductor processing chamber or chambers in which method 300 may be performed. Regardless, method 300 may optionally include delivering a semiconductor substrate to a processing region of a semiconductor processing chamber, such as processing chamber 200 described above, or other chambers that may include components as described above. The substrate may be deposited on a substrate support, which may be a pedestal such as substrate support 212, and which may reside in a processing region of the chamber, such as a processing volume.

The embodiment of the present technology shown in method 300 includes flowing a first deposition precursor into a substrate processing region 302. The first precursor may be a carbon-containing precursor that has at least two reactive groups that can form a bond with a group attached to a surface of a substrate in the substrate processing region. Molecules of the first precursor react with the surface groups to form bonds linking the first precursor molecule to the substrate surface. The reactions between the first precursor molecules and the groups on the substrate surface continue until most or all the surface groups are bonded to a reactive group on the first precursor molecules. A first portion of a compound layer of the deposition precursors is formed that blocks further reaction between first precursor molecules in the first precursor effluent and the substrate.

The formation rate of the first portion of the compound layer may depend on the temperature of the substrate as well as the temperature of the deposition precursors that flow into the substrate processing region. Exemplary substrate temperatures during the formation operations may be greater than or about 50° C., greater than or about 60° C., greater than or about 70° C., greater than or about 80° C., greater than or about 90° C., greater than or about 100° C., greater than or about 110° C., greater than or about 120° C., greater than or about 130° C., greater than or about 140° C., greater than or about 150° C., or higher. By maintaining the substrate temperature elevated, such as above or about 100° C. in some embodiments, an increased number of nucleation sites may be available along the substrate, which may improve formation and reduce void formation by improving coverage at each location.

The deposition precursors may be delivered at any number of temperatures to effect increase ligand formation across the substrate to improve initial formation and coverage across the substrate. The first deposition precursor may be delivered at a temperature above or about 80° C., and may be delivered at a temperature greater than or about 90° C., greater than or about 100° C., greater than or about 110° C., or greater. By increasing the deposition of the first precursor, an increased number of deposit sites may be formed, which may more seemlessly grow material on the substrate. Additionally, this may allow the second deposition precursor to be delivered at a temperature less than the first temperature. In some embodiments the reaction between the second deposition precursor and the first deposition precursor may occur more readily than a reaction between the first deposition precursor and the substrate, and thus delivering the first deposition precursor at an elevated temperature may ensure adequate formation across the substrate. The second deposition precursor may then react with reactive groups of the first deposition precursor at reduced temperatures. For example, the second deposition precursor may be delivered at a temperature less than or about 100° C., and may be delivered at a temperature less than or about 90° C., less than or about 80° C., less than or about 70° C., less than or about 60° C., less than or about 50° C., less than or about 40° C., or less.

The formation rate of the first portion of the compound layer may also depend on the pressure of the first deposition precursor effluent in the substrate processing region. Exemplary effluent pressures in the substrate processing region may range from about 1 mTorr to about 500 Torr. Additional exemplary ranges include 1 Torr to about 20 Torr, 5 Torr to 15 Torr, and 9 Torr to 12 Torr, among other exemplary ranges.

The first deposition precursor effluent may remain in the substrate processing region for a period of time to nearly or completely form the first portion of the compound layer. The precursors may be delivered in alternating pulses to grow the material. In some embodiments, the pulse times of either or both of the first deposition precursor and the second deposition precursor may be greater than or about 0.5 seconds, greater than or about 1 second, greater than or about 2 seconds, greater than or about 3 seconds, greater than or about 4 seconds, greater than or about 5 seconds, greater than or about 10 seconds, greater than or about 20 seconds, greater than or about 40 seconds, greater than or about 60 seconds, greater than or about 80 seconds, greater than or about 100 seconds, or more. In some embodiments the first deposition precursor may be pulsed for longer periods of time than the second deposition precursor. Similar to temperature as noted above, by increasing the residence time of the first deposition precursor, improved adhesion may be produced across the substrate. The second deposition precursor may then more readily react with the ligands of the first deposition precursor, and thus the second deposition precursor may be pulsed for less time, which may improve throughput. For example, in some embodiments, the second precursor may be pulsed for less than or about 90% of the time the first precursor is pulsed. The second precursor may also be pulsed for less than or about 80% of the time the first precursor is pulsed, less than or about 70% of the time the first precursor is pulsed, less than or about 60% of the time the first precursor is pulsed, less than or about 50% of the time the first precursor is pulsed, less than or about 40% of the time the first precursor is pulsed, less than or about 30% of the time the first precursor is pulsed, or less.

Method 300 also includes an operation to purge or remove the first deposition precursor effluents from the substrate processing region 304 following the formation of the first portion of the compound layer. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. However, in some embodiments, increased purge time may begin to remove reactive sites, which may reduce uniform formation. Accordingly, in some embodiments the purge may be performed for less than or about 60 seconds, and may be performed for less than or about 50 seconds, less than or about 40 seconds, less than or about 30 seconds, or less. In some embodiments, a purge gas may be introduced to the substrate processing region to assist in the removal of the effluents. Exemplary purge gases include helium and nitrogen, among other purge gases.

After the removal of the first deposition precursor effluents, a second deposition precursor may flow into the substrate processing region 306. The second precursor may be a carbon-containing precursor that has at least two reactive groups that can form bonds with unreacted reactive groups of the first deposition precursor that formed the first portion of the compound layer. Molecules of the second precursor react with the unreacted reactive groups of the first deposition precursor to form bonds linking the second precursor molecules to the first precursor molecules. The reactions between the second and first precursor molecules continue until most or all the unreacted reactive groups on the first precursor molecules have reacted with second precursor molecules. A second portion of a compound layer of the deposition precursors is formed that blocks further reaction between second precursor molecules in the second precursor effluent and the first portion of the compound layer.

The formation rate of the second portion of the compound layer may also depend on the pressure of the second deposition precursor effluent in the substrate processing region. Exemplary effluent pressures in the substrate processing region may range from about 1 Torr to about 20 Torr. Additional exemplary ranges include 5 Torr to 15 Torr, and 9 Torr to 12 Torr, among other exemplary ranges.

Method 300 also includes an operation to purge or remove the second deposition precursor effluents from the substrate processing region 308 following the formation of the second portion of the compound layer. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include helium and nitrogen, among other purge gases.

In the embodiment shown in method 300 there is a determination of whether a target thickness of as-deposited carbon-containing material on the substrate has been achieved 310 following one or more cycles of forming a compound layer (e.g., following the formation of the first and second portions of a compound layer). If a target thickness of as-deposited carbon-containing material has not been achieved, another cycle of forming first and second portions of a compound layer is performed. If a target thickness of as-deposited carbon-containing material has been achieved, another cycle to form another compound layer is not started. Exemplary numbers of cycles for the formation of compound layers may include 1 cycle to 2000 cycles. Additional exemplary ranges for the number of cycles may include 50 cycles to 1000 cycles, and 100 cycles to 750 cycles, among other exemplary ranges. Exemplary ranges of target thickness to discontinue further cycles of forming compound layers include about 10 nm to about 500 nm. Additional exemplary thickness ranges may include about 50 nm to about 300 nm, and 100 nm to about 200 nm, among other exemplary thickness ranges.

In the embodiment shown in method 300 the as-deposited carbon-containing material on the substrate may be annealed 312. Exemplary annealing may involve a thermal anneal of the as-deposited carbon-containing material made up of one or more successive compound layers. Exemplary temperature ranges for the thermal anneal may include about 100° C. to about 600° C. Additional exemplary temperature ranges may include about 200° C. to about 500° C., and about 300° C. to about 450° C., among other temperature ranges. Exemplary times for the thermal anneal may include ranges of about 1 minute to about 120 minutes, about 10 minutes to about 60 minutes, and about 20 minutes to about 40 minutes, among other exemplary time ranges.

In some embodiments, method 300 may include optional treatment operations, such as a pretreatment, that may be performed to prepare a surface of a substrate for deposition. For example, the substrate surface may be exposed to one or more of a chemical etchant, heat treatment, plasma, or passivation gas before introducing the pretreated substrate to the first deposition precursor.

The present technology includes the formation of annealed carbon-containing materials have little shrinkage compared to the as-deposited material. Exemplary shrinkage ranges include less than about 20% shrinkage, less than about 15% shrinkage, less than about 10% shrinkage, less than about 5% shrinkage of the annealed material compared to the as-deposited material. Exemplary shrinkage ranges include about 15% to about 5%, and about 10% to about 5% shrinkage of the annealed material compared to the as-deposited carbon-containing material.

As noted above, a number of molecular-layer-deposition precursors may be used with the present technology to form the carbon-containing material on the substrate. Exemplary deposition precursors include a first deposition precursor and a second deposition precursor. The first deposition precursor may include two or more first deposition reactive groups that are operable to form bonds with a reactive group on the substrate surface and a reactive group on the second deposition precursor. In some embodiments, the two or more deposition reactive groups are the same, and in additional embodiment two of the two or more deposition reactive groups may be different. Examples of first deposition precursors include precursors having the formula:

Y—R$_1$—Y, where R$_1$ may include one or more of an alkyl group, an aromatic group, or a cycloalkyl group, among other groups, and Y may independently include a hydroxide group, an aldehyde group, a ketone group, an acid group, an amino group, an isocyanate group, a thiocyanate group, or an acyl chloride group, among other reactive groups.

Specific examples of first deposition precursors include hydroquinone, terephthalaldehyde, terephthaloyl chloride, and p-phenylenediamine, among others.

The second deposition precursor may include two or more second deposition reactive groups that are operable to form bonds with unreacted reactive groups "Y" on the first deposition precursor. In some embodiments, the two or more second deposition reactive groups are the same, and in additional embodiment two of the two or more second deposition reactive groups are different. Examples of second deposition precursors include precursors having the formula:

Z—R$_2$—Z, where R$_2$ may include one or more of an alkyl group, an aromatic group, or a cycloalkyl group, among other groups, and Z may independently include a hydroxide group, an aldehyde group, a ketone group, an acid group, an amino group, an isocyanate group, a thiocyanate group, or an acyl chloride group, among other reactive groups.

Specific examples of second deposition precursors include ethylene glycol, and ethylene diamine, among others.

The substrate on which the carbon-containing material is formed may include a material in which one or more features may be formed. The substrate may include any number of materials used in semiconductor processing. The substrate material may be or include silicon, germanium, dielectric materials including silicon oxide or silicon nitride, metal materials, or any number of combinations of these materials. The substrate may also include one or more substrate features formed in the substrate. The substrate features may be characterized by any shape or configuration according to the present technology. In some embodiments, the features may be or include a trench structure or aperture formed within the substrate.

Although the substrate features may be characterized by any shapes or sizes, in some embodiments the substrate features may be characterized by higher aspect ratios, or a ratio of a depth of the feature to a width across the feature. For example, in some embodiments substrate features may be characterized by aspect ratios greater than or about 5:1, and may be characterized by aspect ratios greater than or about 10:1, greater than or about 15:1, greater than or about 20:1, greater than or about 25:1, greater than or about 30:1, greater than or about 40:1, greater than or about 50:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:
1. A processing method comprising:
flowing a first deposition precursor into a substrate processing region to form a first portion of an initial compound layer, wherein the first deposition precursor comprises an aldehyde reactive group;
removing a first deposition effluent comprising the first deposition precursor from the substrate processing region;
flowing a second deposition precursor into the substrate processing region, wherein the second deposition precursor comprises an amine reactive group, and wherein the amine reactive group reacts with the aldehyde reactive group, to form a second portion of the initial compound layer;
removing a second deposition effluent comprising the second deposition precursor from the substrate processing region; and
annealing the initial compound layer at a temperature between 300° C. and 600° C. to form an annealed carbon-containing material on a surface of a substrate.

2. The processing method of claim 1, where the processing method further comprises:
depositing at least one additional compound layer on the initial compound layer, wherein the initial compound layer and the at least one additional compound layer form the annealed carbon-containing material on the surface of the substrate.

3. The processing method of claim 1, wherein the first deposition precursor is delivered at a temperature greater than or about 100° C.

4. The processing method of claim 1, wherein the second deposition precursor is delivered at a temperature less than or about 100° C.

5. The processing method of claim 1, wherein the first deposition time and the second deposition time are less than or about 5 seconds.

6. The processing method of claim 1, wherein the first deposition time is longer than the second deposition time.

7. The processing method of claim 1, wherein the flowing of the first deposition precursor increases pressure in the substrate processing region to a pressure range of about 1 mTorr to about 500 Torr.

8. The processing method of claim 1, wherein the removal of the first deposition effluent from the substrate processing region has a removal time of less than or about 60 seconds.

9. The processing method of claim 1, wherein the annealing of the initial compound layer comprises a thermal annealing at a temperature ranging from 300° C. to about 450° C.

10. The processing method of claim 1, wherein the initial compound layer shrinks by less than 10 vol % due to the annealing of the initial compound layer.

11. The processing method of claim 1, wherein the substrate comprises a substrate feature characterized by an aspect ratio of greater than or about 5:1, and wherein the substrate feature is characterized by a width across the substrate feature of less than or about 10 nm.

12. A processing method comprising:
flowing a first deposition precursor into a substrate processing region, wherein the first deposition precursor has a first formula comprising:

$Y_1-R_1-Y_2$, wherein $R_1$ comprises one or more of an alkyl group, an aromatic group, or a cycloalkyl group, and
$Y_1$ and $Y_2$ independently comprise a hydroxide group, an aldehyde group, a ketone group, an acid group, an amino group, an isocyanate group, a thiocyanate group, or an acyl chloride group, and
wherein the first deposition precursor reacts with a reactive group on a surface of a substrate in the substrate processing region to form a first portion of an initial compound layer on the surface of the substrate;
removing a first deposition effluent comprising the first deposition precursor from the substrate processing region;
flowing a second deposition precursor into the substrate processing region, wherein the second deposition precursor has a second formula comprising:

$Z_1-R_2-Z_2$, wherein $R_2$ comprises one or more of an alkyl group, an aromatic group, or a cycloalkyl group, and
$Z_1$ and $Z_2$ independently comprise a hydroxide group, an aldehyde group, a ketone group, an acid group, an amino group, an isocyanate group, a thiocyanate group, or an acyl chloride group,
wherein the second deposition precursor reacts with the first portion of the initial compound layer to form a second portion of the initial compound layer;
removing a second deposition effluent comprising the second deposition precursor from the substrate processing region; and
annealing the initial compound layer at a temperature between 300° C. and 600° C. to form an annealed carbon-containing material on the surface of the substrate.

13. The processing method of claim 12, wherein $R_1$ comprises an aromatic group, $Y_1$ and $Y_2$ independently comprise an aldehyde group or an isocyanate group, $R_2$ comprises an alkyl group, and $Z_1$ and $Z_2$ comprise an amino group.

14. The processing method of claim 12, wherein the first deposition precursor comprises terephthalaldehyde or 1,4-phenylene diisocyanate.

15. The processing method of claim 12, wherein the second deposition precursor comprises ethylene diamine.

16. The processing method of claim 12, wherein the removing of the first deposition precursor comprises:
flowing a purge gas into the substrate processing region; and
removing a mixture of the first deposition effluent and the purge gas from the substrate processing region.

17. The processing method of claim 16, wherein the purge gas comprises helium.

18. A processing method comprising:
performing two or more cycles of forming a carbon-containing composite layer on a substrate to form two or more carbon-containing composite layers;
wherein each of the two or more cycles of forming the carbon-containing composite layer comprises:
forming a first portion of an initial compound layer on a surface of the substrate, wherein the first portion of the initial compound layer is formed by flowing a first deposition precursor into a substrate processing region, wherein the first deposition precursor reacts with a reactive group on the surface of the substrate in the substrate processing region to form the first portion of the initial compound layer wherein the first deposition precursor is delivered into the substrate processing region at a first temperature, and
forming a second portion of the initial compound layer on at least a portion of the first portion of the initial compound layer, wherein the second portion of the initial compound layer is formed by flowing a second deposition precursor into the substrate processing region, wherein the second deposition precursor reacts with the first portion of the initial compound layer to form the second portion of the initial compound layer, and wherein the second deposition precursor is delivered into the substrate processing region at a second temperature less than the first temperature; and
annealing the two or more carbon-containing composite layers on the substrate to form an annealed carbon-containing material on the surface of the substrate.

19. The processing method of claim 18, wherein the first deposition precursor comprises terephthalaldehyde or 1,4-phenylene diisocyanate, and the second deposition precursor comprises ethylene diamine.

20. The processing method of claim 18, wherein the two or more carbon-containing composite layers shrink by less than 10 vol % due to the annealing of the two or more carbon-containing composite layers.

\* \* \* \* \*